United States Patent [19]
Frommer et al.

[11] Patent Number: 5,939,899
[45] Date of Patent: Aug. 17, 1999

[54] MOSFET SUBSTRATE CURRENT LOGIC

[75] Inventors: Aviv Frommer, Haifa, Israel; Mark R. Pinto, Summit, N.J.

[73] Assignee: Lucent Technologies Inc., Murray Hill, N.J.

[21] Appl. No.: 08/842,123

[22] Filed: Apr. 23, 1997

[51] Int. Cl.[6] .......................... H03K 19/094; H03K 19/20
[52] U.S. Cl. ................................ 326/119; 326/55; 326/49
[58] Field of Search .................................. 326/121, 119, 326/112, 52, 53, 54, 55, 49, 50, 21

[56] References Cited

U.S. PATENT DOCUMENTS

| | | | |
|---|---|---|---|
| 3,502,909 | 3/1970 | Christensen et al. | 326/119 |
| 4,072,868 | 2/1978 | De La Moneda | 326/112 |
| 4,999,687 | 3/1991 | Luryi et al. . | |
| 5,381,056 | 1/1995 | Murphy | 326/21 |
| 5,461,245 | 10/1995 | Gribnikov et al. . | |
| 5,473,269 | 12/1995 | Dickinson | 326/93 |
| 5,821,769 | 10/1998 | Douseki | 326/34 |

OTHER PUBLICATIONS

"Charge injection logic", by Serge Luryi et al., App. Phys. Lett 57(17), Oct. 22, 1990, 1990 American Institute of Physics, pp. 1787–1789.

"A New Functional, Resonant–Tunneling Hot Electron Transistor (RHET)", by Naoki Yokoyama et al., Japanese Journal of Applied Physics, vol. 24, No. 11, Nov. 1985, pp. L853–L854.

"A Symmetric 0.25$\mu$m CMOS Technology For Low–Power, High–Performance ASIC Applications Using 248nm DUV Lithography", by D.M. Boulin et al., 1995 Symposium on VLSI Technology Digest of Technical Papers, pp. 65–66.

"A 34-ns 1-Mbit CMOS SRAM Using Triple Polysilicon", by Tomohisa Wada et al., IEEE Journal of Solid–State Circuits, vol. SC–22, No. 5, Oct. 1987, pp. 727–732.

*Primary Examiner*—Michael Tokar
*Assistant Examiner*—Daniel D. Chang

[57] ABSTRACT

Logic devices of the present invention have one or more MOSFETs that are configured to operate in logic circuits, where voltages applied to the source and drain of each MOSFET are treated as logic inputs to the circuit and the resulting substrate current is treated as the logic output of the circuit. In one implementation, a MOSFET is configured in a circuit to operate as an XOR gate where a load resistor between the substrate and ground converts the substrate current into an output voltage. A sample-and-hold circuit samples and holds the output voltage to isolate the XOR gate thereby allowing DC power dissipation to be reduced. In another implementation, three MOSFETs are configured to operate as an "ORNAND" logic device that performs the logical addition of the OR function and the NAND function.

22 Claims, 3 Drawing Sheets

MOSFET SUBSTRATE CURRENT LOGIC

BACKGROUND OF THE INVENTION

1. Field of the Invention

The present invention relates to solid-state electronics, and, in particular, to MOSFET-based logic devices.

2. Description of the Related Art

Recently, several new devices have been proposed to increase the functional density of integrated circuits. For example, U.S. Pat. No. 4,999,687 (Luryi et al.) ("the '687 patent") describes a three-input solid-state logic device that performs the logical operation of Expression (1) as follows:

$$(X+Y+Z)'+(XYZ) \quad (1)$$

where X, Y, and Z are the three logical inputs to the device. The first half of Expression (1) (i.e., $(X+Y+Z)'$) is a NOR operation, while the second half (i.e., $(XYZ)$) is an AND operation. As such, the device of Expression (1), which performs the logical sum of NOR and AND, and may be called a NORAND device. The functionality of logic devices, such as the NORAND device, may reduce both the number of elements and the complexity of logic circuits built with such logic devices.

The NORAND device of the '687 patent relies on the characteristics of a charge injection transistor (CHINT), such that real space transfer occurs when carriers spill over an energy barrier that is part of the heterostructure of the CHINT. There are several disadvantages of CHINT implementations. First, pure CHINT logic has drawbacks like power dissipation and needing level shifting of outputs after a few stages of logic, since the logic "zero" cannot be preserved through multiple stages. Additionally, there would be a need for memory and other things that may not be easily implemented in a single CHINT technology.

SUMMARY OF THE INVENTION

The present invention is directed to a logic device comprising one or more MOSFETs configured such that each channel input of each MOSFET is a logic input to the logic device and the substrate current of the one or more MOSFETs is a logic output of the logic device.

The present invention is also directed to a method for operating a logic device comprising one or more MOSFETs. Two or more logic inputs are applied to the two or more channel contacts of the one or more MOSFETs, and the substrate current of the one or more MOSFETs is treated as a logic output of the logic device.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
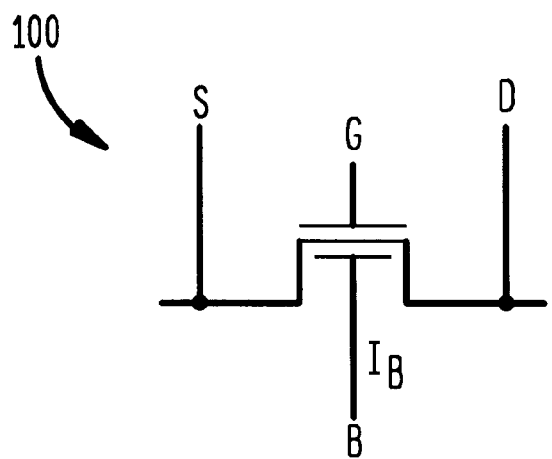
FIG. 1 shows a schematic representation of a metal oxide semiconductor field effect transistor (MOSFET)

FIG. 1 shows a schematic representation of a metal oxide semiconductor field effect transistor (MOSFET) 100 having source node S, drain node D, gate node G, and substrate or base node B. When MOSFET 100 is biased in the saturation region, a substrate current $I_B$ appears, as a consequence of impact ionization. In conventional applications, this substrate current is a nuisance for the operation of a MOSFET and attempts are typically made to reduce this current and/or its effect on overall circuit operations. The inventors have recognized, however, that this substrate current may be advantageously used to implement logic operations using circuits implemented with one or more MOSFETs.

According to one embodiment of the present invention, MOSFET 100 of FIG. 1 may be used as a logic device that performs the XOR operation. When the source S and drain D of MOSFET 100, which play symmetric roles in MOSFET operation, are treated as logic inputs, the resulting substrate current can be treated as the logic output of a logic device comprising MOSFET 100. For example, in a particular implementation, with the gate and substrate voltages fixed at $V_G=2.0$ V and $V_B=-2.0$ V, respectively, the source and drain voltages may be varied from a low of 0 V to a high of 4 V with 0 V corresponding to the logic input 0 and 4 V corresponding to a logic input 1.

Figure 2:
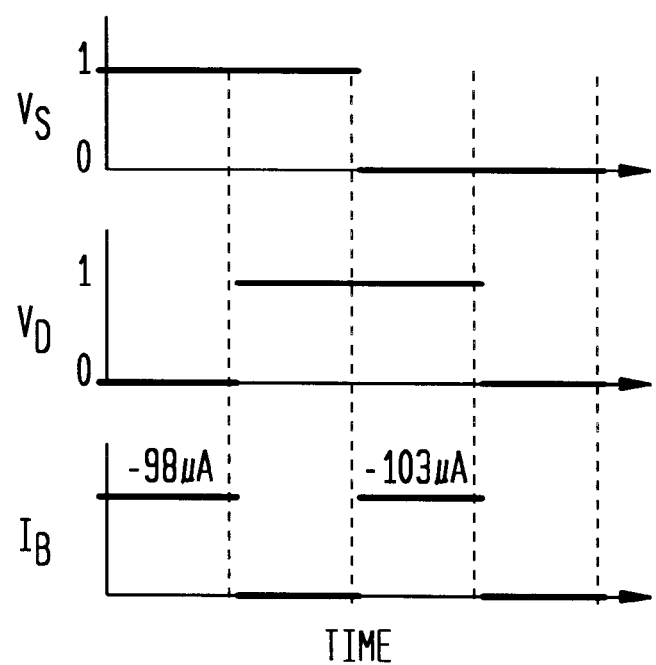
FIG. 2 shows a graphical representation of the relationship between source voltage $V_S$ and drain voltage $V_D$, on the one hand, and substrate current $I_B$, on the other, when the MOSFET of FIG. 1 is configured as a logic device.

FIG. 2 shows a graphical representation of the relationship between source voltage $V_S$ and drain voltage $V_D$, on the one hand, and substrate current $I_B$, on the other, when MOSFET 100 of FIG. 1 is configured as a logic device. When $V_S$ and $V_D$ are both high (logic 1) or both low (logic 0), the magnitude of the substrate current $I_B$ is low (i.e., close to zero). Otherwise, the magnitude of the substrate current $I_B$ is high (i.e., approximately −100 microamps). If the substrate current $I_B$ is treated as a logic output, MOSFET 100 can be said to operate as an XOR logic device. In this example, measurements were performed on L=0.4 micron coded n-channel devices fabricated with a symmetric 0.25-micron CMOS technology. The gate voltage $V_G$ and the substrate voltage $V_B$ were chosen to maximize the substrate-current-to-drain-current ratio ($I_B/I_D$) in order to minimize power consumption at the drain output.

Figure 3:
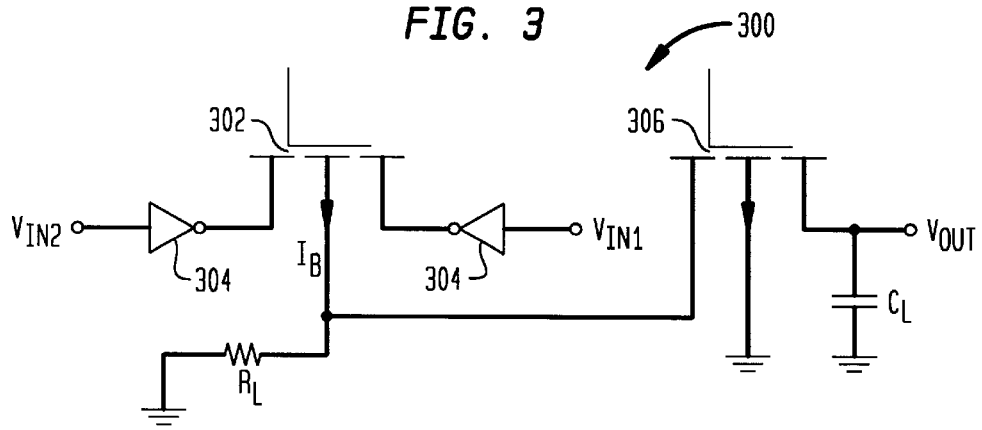
FIG. 3 shows a schematic diagram of a logic circuit, according to one embodiment of the present invention.

FIG. 3 shows a schematic diagram of a logic circuit 300, according to one embodiment of the present invention. Logic circuit 300 comprises "XOR" MOSFET 302 (e.g., a standard nMOSFET) with conventional CMOS inverters 304 of the same technology connected to the source and drain (i.e., channel) inputs and output load $R_L$ (e.g., a polysilicon resistor) connecting the substrate of MOSFET 302 to ground. Logic circuit 300 also comprises pass transistor 306 and output capacitor $C_L$, which together operate as a sample-and-hold circuit, as described below.

As configured, logic circuit 300 can be operated as an XOR circuit by switching the source and drain inputs to MOSFET 302 with conventional CMOS inverters 304 with logic inputs $V_{IN1}$ and $V_{IN2}$ to logic circuit 300. The designation of which channel contact of MOSFET 302 is the source and which is the drain depends upon the relative voltages applied to those contacts. Resistor $R_L$ converts the substrate current $I_B$ into an output voltage. In order to avoid using negative back-gate biasing to increase $I_B$ as described above for FIGS. 1 and 2, $R_L$ is relatively large (e.g., 10 mega-ohms) in order to achieve an acceptable output voltage swing. Resistor $R_L$ may be fabricated, for example, by preventing the resistor areas from being implanted during normal processing of an existing polysilicon layer, or by adding a special thin polysilicon layer to the process.

In order to prevent DC power dissipation, the output voltage is transferred through pass transistor 306 to an output node that can be isolated (by turning "off" transistor 306) from MOSFET 302 (the XOR switch transistor). That is, pass transistor 306 and capacitor $C_L$ operate as a sample-and-hold circuit that samples the voltage across resistor $R_L$ when pass transistor 306 is "on" and holds the sampled voltage in capacitor $C_L$ when transistor 306 is "off" for read-out as output voltage $V_{OUT}$. When transistor 306 is turned "off," MOSFET 302 can also be turned off, thereby reducing DC power dissipation within logic circuit 300. Output voltage $V_{OUT}$ may be treated as the logic output of logic circuit 300, which, as shown in FIG. 2, operates as an XOR gate.

Figure 4:
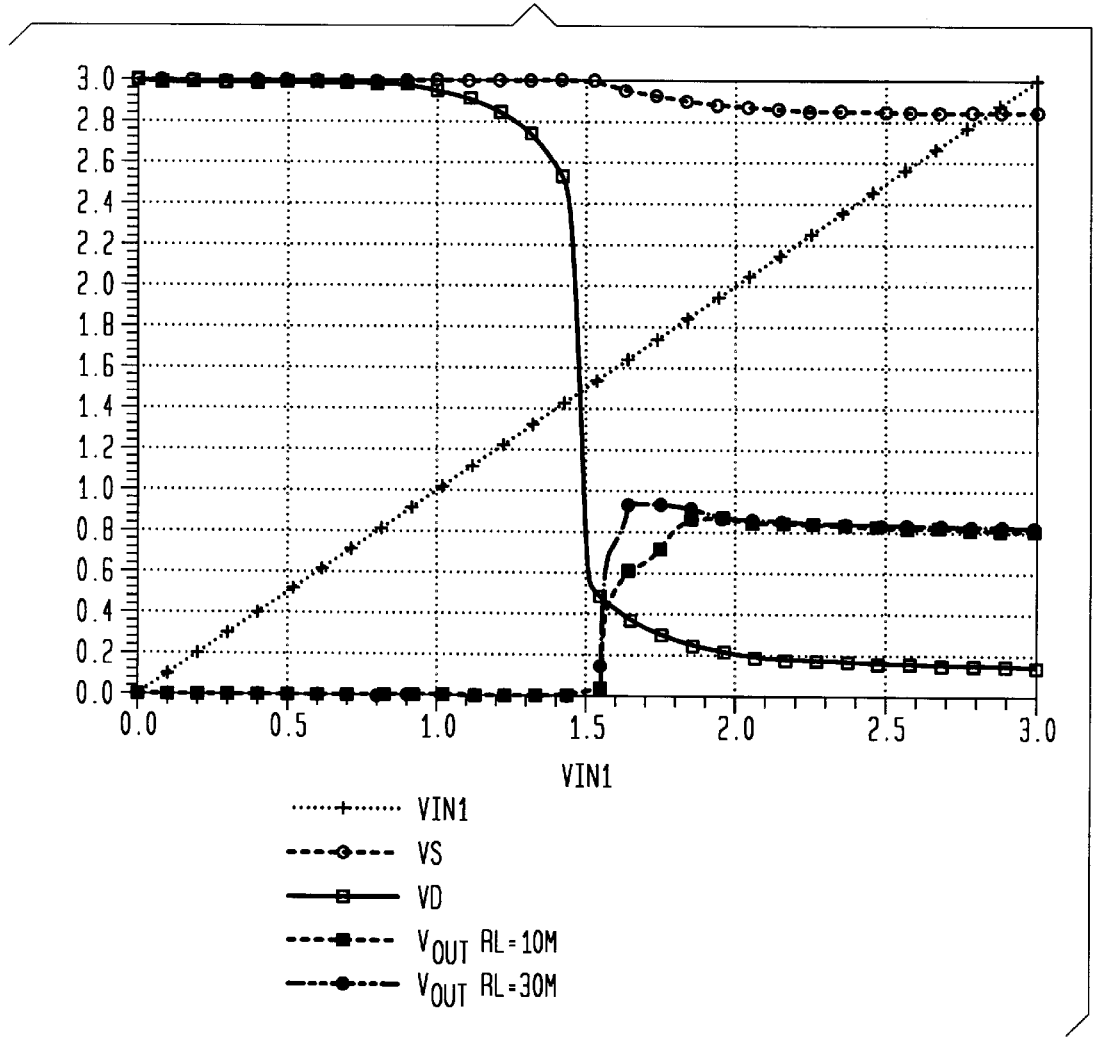
FIG. 4 shows a graphical representation of simulation results for the logic circuit of FIG. 3.

FIG. 4 shows a graphical representation of simulation results for logic circuit 300 of FIG. 3. With $V_{IN2}$ fixed low (0.0 V), $V_{IN1}$ is increased from low (0.0 V) to high (3.0 V). Initially, with both $V_{IN1}$ and $V_{IN2}$ low, the source and drain voltages of MOSFET 302 are both high (3.0 V). As $V_{IN1}$ is ramped from 0.0 V to 3.0 V, the source-drain voltage drop $V_{SD}$ increases, MOSFET 302 starts to conduct, and the voltage at node B ($V_B$) and $V_{OUT}$ both increase from 0.0 V to about 0.8 V. The increase in $V_B$ (and $V_{OUT}$) always saturates around 0.8 V (corresponding to a substrate-drain voltage drop $V_{BD}$ of around 0.7 V), since either the drain-substrate junction or the source-substrate junction becomes positively biased and starts to conduct. The saturation of $V_B$ (and $V_{OUT}$) around 0.8 V is insensitive to the exact value of $R_L$ over a very large range of resistances ($R_L$>5 mega-ohms). Thus, implementation of polysilicon resistors, where a spread in parameters is expected, is possible.

The charge at the output node is 'volatile' in that it is not connected to either $V_{CC}$ or ground, and will thus eventually leak away through the adjacent junctions. The gate is therefore preferably pulsed in periodic intervals so that the logic output remains valid at all times. An XOR gate based on the design of FIG. 3 has only two transistors and a resistor.

It may be possible to adjust the threshold voltage of conventional CMOS logic to be switched by the approximate 0.8 V voltage swing available at the output of substrate current-based logic gates such as logic circuit 300 of FIG. 3. In this case, it would be possible to design circuits with alternating stages of properly designed CMOS and substrate current-based logic gates feeding one another.

Figure 5:
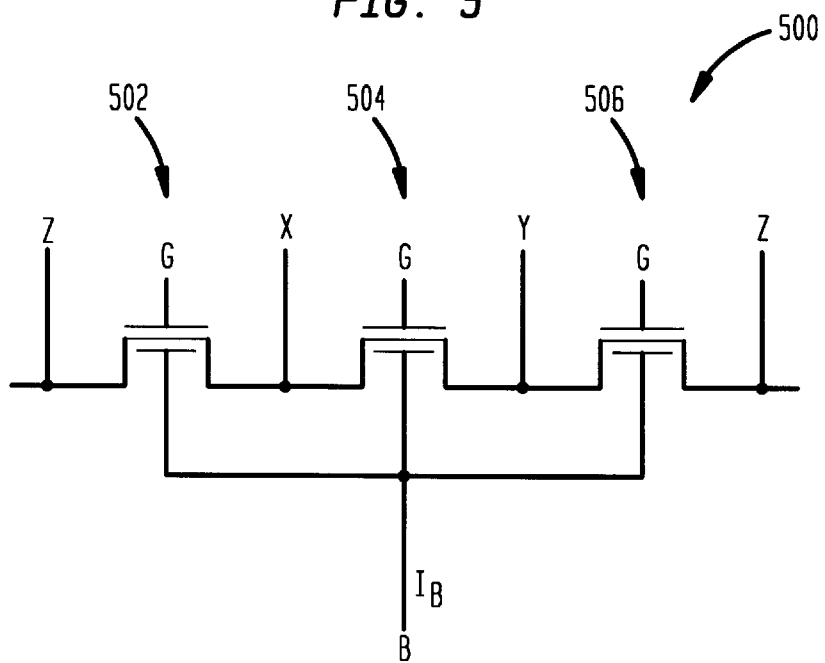
FIG. 5 shows a schematic representation of a device, according to an alternative embodiment of the present invention.

FIG. 5 shows a schematic representation of device 500, according to an alternative embodiment of the present invention. Device 500 comprises three MOSFETs (502, 504, and 506) configured to operate as a three-input logic device with the three MOSFETs sharing a common substrate node B. Each MOSFET has two channel contacts, where the channel contacts correspond to the source node and drain node of the MOSFET. As shown in FIG. 5, one of the two channel contacts of MOSFET 502 is connected to one of the two channel contacts of MOSFET 504, and the second channel contact of MOSFET 504 is connected to one of the two channel contacts of MOSFET 506. The designation of which channel contact is the source node and which channel contact is the drain node depends on the relative biasing of those nodes.

In another implementation, the channel contacts connecting MOSFETs 502 and 504 are a single merged junction shared by the two devices, and the channel contacts connecting MOSFETs 504 and 506 are another single merged junction shared by the two devices. In general, for a device of the present invention having two or more MOSFETs, zero, one, or more pairs of adjacent MOSFETs in the device may share a single merged junction, while other pairs of MOSFETs in the device do not.

When properly biased by gate voltage $V_G$ and substrate voltage $V_B$, device 500 can be operated as a logic device by treating the inputs X, Y, and Z of FIG. 5 as three logic inputs to device 500, wherein input Z is applied to both the first channel contact of MOSFET 502 and the second channel contact of MOSFET 506. This latter feature may be achieved within the structure of device 500 (e.g., by physically interconnecting those two channel contacts) or by operation (e.g., by applying the same input in parallel to both contacts). In any case, when device 500 is part of a logic circuit such as circuit 300 of FIG. 3 (e.g., replacing MOSFET 302), the substrate current $I_B$ may be treated as the logic output of device 500.

Figure 6:
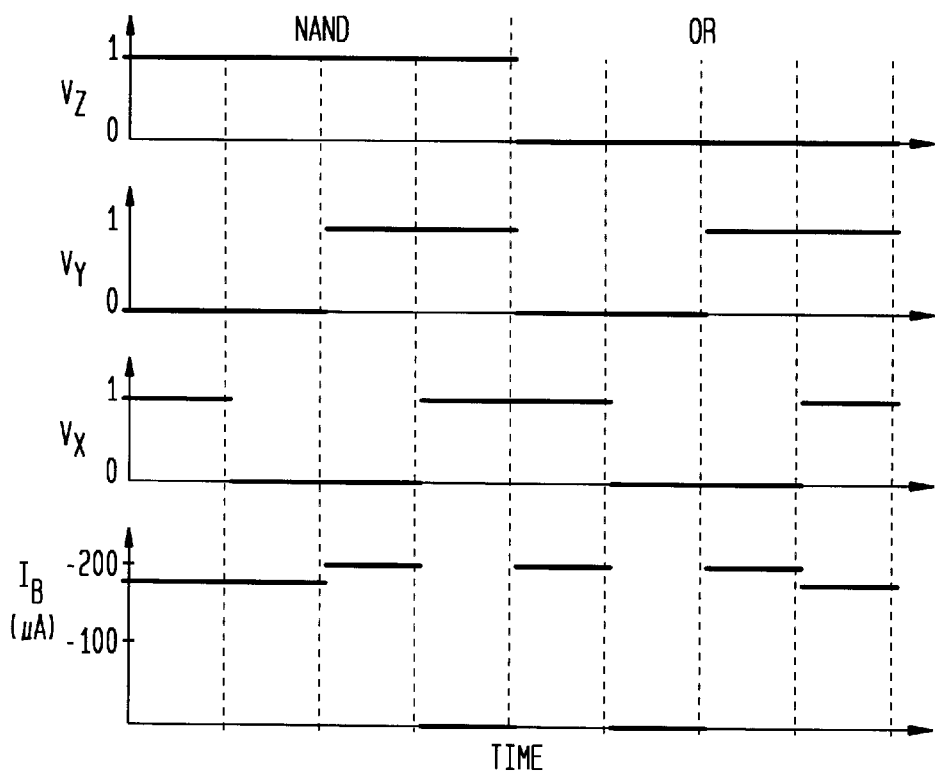
FIG. 6 shows a graphical representation of the relationship between the three input voltages $V_X$, $V_Y$, and $V_Z$, on the one hand, and substrate current $I_B$, on the other, when the device of FIG. 5 is configured as a logic device.

FIG. 6 shows a graphical representation of the relationship between the three input voltages $V_X$, $V_Y$, and $V_Z$, on the one hand, and substrate current $I_B$, on the other, when device 500 of FIG. 5 is configured as a logic device. As shown in FIG. 6, when $V_X$, $V_Y$, and $V_Z$ are all three high (logic 1) or all three low (logic 0), the magnitude of the substrate current $I_B$ is low (i.e., close to zero). Otherwise, in any of the six other possible configurations, the magnitude of the substrate current $I_B$ is high (i.e., approximately −200 microamps), resulting from impact ionization in two of the three channels (X-Y, Y-Z, or Z-X). Three of these six other configurations correspond to the presence of two sources and one drain, while the remaining three configurations correspond to the presence of two drains and one source.

If the magnitude of the substrate current $I_B$ is treated as a logic output, device 500 can be said to operate as a logic device that performs the logic operation of Expression (2) as follows:

$$(X+Y+Z)+(XYZ)' \qquad (2)$$

The first half of Expression (2) (i.e., (X+Y+Z)) is an OR operation, while the second half (i.e., (XYZ)') is a NAND operation. For this reason, the device of Expression (2), which operates as the logical sum of OR and NAND, may be called a ORNAND device.

In one possible mode of operation, any one of the input electrodes (e.g., Z) can be treated as a control electrode, while the other two (in this case, X and Y) are treated as the input terminals. When Z is low, the ORNAND device of FIG. 5 applies the OR operation to X and Y, and when Z is high, the ORNAND device of FIG. 5 applies the NAND operation to X and Y. The threefold symmetry of the device ensures that the substrate current has the same value in all six states that correspond to $I_B$=high. A similar effect can be achieved with a cylindrical arrangement of the input electrodes.

In order to demonstrate the operation of the ORNAND device of FIG. 5, a circuit consisting of three similar discrete nMOSFETs was assembled. The substrate was biased at $V_B$=−2 V, the gates were biased at $V_G$=2 V, and the input signals were varied between a low of 0 V and a high of 4 V. The split electrode Z, chosen as the control was fixed at low $V_Z$=0V for the OR function and high $V_Z$=4 V for the NAND function. The results are shown in FIG. 6.

Unlike other XOR and ORNAND designs proposed previously using charge injection transistors or hot electron resonant tunneling transistors, the substrate current-based gates of the present invention are completely compatible with CMOS processing technology, and could be integrated onto the same chip with conventional CMOS logic. In order to achieve such integration, the logic current output may be translated to a voltage swing on a capacitive load, such as shown in the circuit of FIG. 3, where both CMOS and substrate current gates use the same supply voltage $V_{CC}$.

Since XOR functions are widely used in implementing integrated circuit subsystems such as adders, comparators, and parity generators/checkers, using substrate current-based XOR gates, such as that shown in FIG. 3, may cut the transistor count of such subsystems in half. Further optimization of MOSFETs for $I_B$ logic performance is possible. $I_B$ may be made high using, for example, source/drain junction engineering methods. This may increase speed, even though hot-carrier degradation may become a problem. Other designs may use a negative reference voltage instead of grounding $R_L$. This may be used to increase the output voltage swing.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A logic device comprising one or more MOSFETs configured such that each channel input of each MOSFET is a logic input to the logic device and the substrate current of the one or more MOSFETs is a logic output of the logic device, wherein, for logic devices comprising two or more MOSFETs, the substrates of the two or more MOSFETs are interconnected and at least one channel node of each MOSFET is connected to a channel node of at least one other MOSFET to form a logic input to the logic device.

2. The invention of claim 1, comprising one MOSFET, wherein:
   one of the channel contacts of the MOSFET is adapted to receive a first logic input; and
   the other channel contact of the MOSFET is adapted to receive a second logic input.

3. The invention of claim 2, further comprising a load attached to the substrate of the MOSFET, wherein the load is adapted to convert the substrate current into an output voltage corresponding to the logic output of the logic device.

4. The invention of claim 3, wherein the logic device is adapted to operate as an XOR device.

5. The invention of claim 3, further comprising a sample-and-hold circuit connected to the load and adapted to sample and hold the output voltage.

6. The invention of claim 5, wherein the sample-and-hold circuit comprises a pass transistor connected at one channel input to the substrate of the MOSFET and a capacitor connected to the other channel input of the pass transistor, wherein, when the pass transistor is on, the capacitor samples the output voltage, and, when the pass transistor is off, the capacitor holds the sampled output voltage.

7. The invention of claim 1, comprising three MOSFETs, wherein:
   the substrates of the three MOSFETs are interconnected;
   one of the two channel contacts of the first MOSFET is connected to one of the two channel contacts of the second MOSFET and is adapted to receive a first logic input;
   the other channel contact of the second MOSFET is connected to one of the two channel contacts of the third MOSFET and is adapted to receive a second logic input; and
   the other channel contact of the first MOSFET and the other channel contact of the third MOSFET are adapted to receive a third logic input.

8. The invention of claim 7, further comprising a load attached to the substrates of the three MOSFETs, wherein the load is adapted to convert the substrate current into an output voltage corresponding to the logic output of the logic device.

9. The invention of claim 8, wherein the logic device is adapted to operate as an ORNAND device.

10. The invention of claim 8, further comprising a sample-and-hold circuit connected to the load and adapted to sample and hold the output voltage.

11. The invention of claim 10, wherein the sample-and-hold circuit comprises a pass transistor connected at one channel input to the substrates of the three MOSFETs and a capacitor connected to the other channel input of the pass transistor, wherein, when the pass transistor is on, the capacitor samples the output voltage, and, when the pass transistor is off, the capacitor holds the sampled output voltage.

12. The invention of claim 7, wherein the channel contacts connecting the first and second MOSFETs are a single merged junction and the channel contacts connecting the second and third MOSFETs are another single merged junction.

13. The invention of claim 1, further comprising:
   a load attached to the substrates of the one or more MOSFETs, wherein the load is adapted to convert the substrate current into an output voltage corresponding to the logic output of the logic device; and
   a sample-and-hold circuit connected to the load and adapted to sample and hold the output voltage.

14. The invention of claim 13, wherein the sample-and-hold circuit comprises a pass transistor connected at one channel input to the substrates of the one or more MOSFETs and a capacitor connected to the other channel input of the pass transistor, wherein, when the pass transistor is on, the capacitor samples the output voltage, and, when the pass transistor is off, the capacitor holds the sampled output voltage.

15. The invention of claim 1, comprising two or more MOSFETs, wherein each of one or more pairs of the MOSFETs share a single merged junction.

16. A method for operating a logic device comprising one or more MOSFETs, comprising the steps of:
   (a) applying two or more logic inputs to the two or more channel contacts of the one or more MOSFETs; and
   (b) treating the substrate current of the one or more MOSFETs as a logic output of the logic device, wherein, for logic devices comprising two or more MOSFETs, the substrates of the two or more MOSFETs are interconnected and at least one channel node of each MOSFET is connected to a channel node of at least one other MOSFET to form a logic input to the logic device.

17. The invention of claim 16, wherein step (b) comprises the step of converting the substrate current into an output voltage.

18. The invention of claim 17, wherein step (b) further comprises the steps of sampling and holding the output voltage.

19. The invention of claim 16, wherein:

the logic device comprises one MOSFET;

step (a) comprises the step of applying two logic inputs to the channel contacts of the MOSFET; and step (b) comprises the step of treating the substrate current as an XOR output of the logic device.

20. The invention of claim 16, wherein:

the logic device comprises three MOSFETs, wherein:

the substrates of the three MOSFETs are interconnected;

one of the two channel contacts of the first MOSFET is connected to one of the two channel contacts of the second MOSFET and is adapted to receive a first logic input;

the other channel contact of the second MOSFET is connected to one of the two channel contacts of the third MOSFET and is adapted to receive a second logic input; and the other channel contact of the first MOSFET and the other channel contact of the third MOSFET are adapted to receive a third logic input;

step (a) comprises the step of applying three logic inputs to the channel contacts of the three MOSFETs; and step (b) comprises the step of treating the substrate current as an ORNAND output of the logic device.

21. The invention of claim 20, wherein the channel contacts connecting the first and second MOSFETs are a single merged junction and the channel contacts connecting the second and third MOSFETs are another single merged junction.

22. The invention of claim 16, comprising two or more MOSFETs, wherein each of one or more pairs of the MOSFETs share a single merged junction.

* * * * *